US011075076B2

(12) United States Patent
Umehara et al.

(10) Patent No.: US 11,075,076 B2
(45) Date of Patent: Jul. 27, 2021

(54) METHOD FOR MANUFACTURING A SEMICONDUCTOR DEVICE AND FILM DEPOSITION APPARATUS

(71) Applicant: Tokyo Electron Limited, Tokyo (JP)

(72) Inventors: Takahito Umehara, Iwate (JP); Masato Koakutsu, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/196,111

(22) Filed: Nov. 20, 2018

(65) Prior Publication Data

US 2019/0172707 A1 Jun. 6, 2019

(30) Foreign Application Priority Data

Dec. 1, 2017 (JP) .............................. JP2017-232122
Mar. 30, 2018 (JP) .............................. JP2018-069515

(51) Int. Cl.

| H01L 21/00 | (2006.01) |
|---|---|
| H01L 21/02 | (2006.01) |
| H01L 21/321 | (2006.01) |
| H01L 21/225 | (2006.01) |
| H01L 21/687 | (2006.01) |
| C23C 16/52 | (2006.01) |
| H01L 27/11582 | (2017.01) |
| C23C 16/40 | (2006.01) |

(Continued)

(52) U.S. Cl.
CPC ........ *H01L 21/02299* (2013.01); *C23C 16/06* (2013.01); *C23C 16/401* (2013.01); *C23C 16/45544* (2013.01); *C23C 16/52* (2013.01); *H01L 21/0228* (2013.01); *H01L 21/02164* (2013.01); *H01L 21/02208* (2013.01); *H01L 21/02211* (2013.01); *H01L 21/02219* (2013.01); *H01L 21/02271* (2013.01); *H01L 21/225* (2013.01); *H01L 21/321* (2013.01); *H01L 21/68764* (2013.01); *H01L 21/68771* (2013.01); *H01L 27/1157* (2013.01); *H01L 27/11582* (2013.01)

(58) Field of Classification Search
CPC ........ H01L 21/02299; H01L 21/02164; H01L 21/02208; H01L 21/02211; H01L 21/02219; H01L 21/02271; H01L 21/0228; H01L 21/228; H01L 21/321; H01L 21/68764; H01L 21/68771
See application file for complete search history.

(56) References Cited

U.S. PATENT DOCUMENTS

| 5,324,498 A * | 6/1994 | Streusand ............. C01G 41/04 423/489 |
|---|---|---|
| 7,651,730 B2 * | 1/2010 | Hasebe ............... C03C 17/245 427/248.1 |

(Continued)

FOREIGN PATENT DOCUMENTS

| JP | 2012-138500 | 7/2012 |
|---|---|---|
| JP | 2015-056633 | 3/2015 |
| WO | 2015/080058 | 6/2015 |

*Primary Examiner* — Richard A Booth
(74) *Attorney, Agent, or Firm* — IPUSA, PLLC

(57) ABSTRACT

A method for manufacturing a semiconductor device is provided. In the method, impurities contained in a first layer formed on a substrate are removed by heating the first layer. On the first layer, a second layer is formed containing a component that forms a substance that is able to vaporize by reacting with the impurities.

2 Claims, 12 Drawing Sheets

(51) Int. Cl.
  *C23C 16/06* (2006.01)
  *C23C 16/455* (2006.01)
  *H01L 27/1157* (2017.01)

(56) References Cited

U.S. PATENT DOCUMENTS

| | | | |
|---|---|---|---|
| 9,293,321 B2 * | 3/2016 | Tamura | H01L 21/02271 |
| 9,460,413 B2 * | 10/2016 | Elwood | G01K 1/022 |
| 2017/0125437 A1 * | 5/2017 | Pachamuthu | H01L 29/7883 |

* cited by examiner

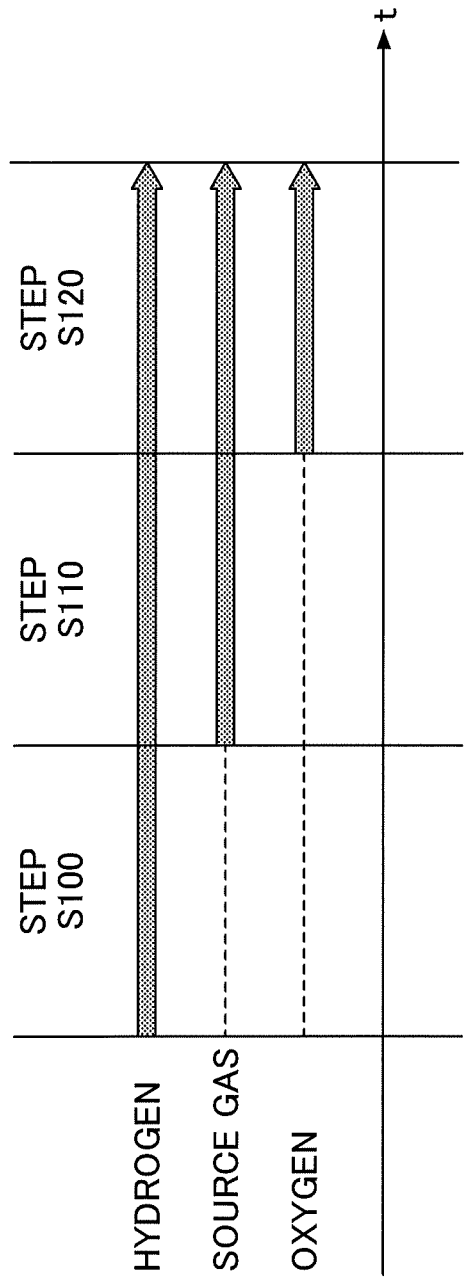

METHOD FOR MANUFACTURING A SEMICONDUCTOR DEVICE AND FILM DEPOSITION APPARATUS

CROSS-REFERENCE TO RELATED APPLICATION

The present application is based upon and claims priority to Japanese Patent Application No. 2017-232122, filed on Dec. 1, 2017, and Japanese Patent Application No. 2018-069515, filed on Mar. 30, 2018, the entire contents of which are incorporated herein by reference.

BACKGROUND OF THE INVENTION

1. Field of the Invention

The present invention relates to a method for manufacturing a semiconductor device and a film deposition apparatus.

2. Description of the Related Art

In semiconductor devices, tungsten (W) is widely used as a material for filling a contact hole and the like formed in a semiconductor wafer (which is referred to as a "wafer" hereinafter) and its barrier material to prevent mutual diffusion, or used as a material for forming a gate electrode and the like of a transistor.

The tungsten film is deposited by PVD (Physical Vapor Deposition) or CVD (Chemical Vapor Deposition), for example. In CVD, a method is known in which a reaction of $WF_6+3H_2 \rightarrow W+6HF$ is caused on a wafer by using tungsten hexafluoride ($WF_6$) gas as a source gas and $H_2$ gas as a reducing gas, for example. Moreover, PCT International Publication No. WO 2015/080058 pamphlet discloses Atomic Layer Deposition in which $WF_6$ gas and $H_2$ gas are alternately supplied.

When a silicon oxide film is deposited on a tungsten film formed using tungsten hexafluoride ($WF_6$) gas as the source gas, avoid (pinhole) is likely to occur at a boundary between the silicon oxide film and the tungsten film. The presence of void causes a problem of a device, and moreover, generation of many voids causes peel of the silicon oxide film. Hence, depositing a silicon oxide film without forming a void is demanded.

The void seems to occur because fluorine remaining in the tungsten film as impurities bonds with silicon at the boundary between the tungsten film and the silicon oxide film, and silicon tetrafluoride ($SiF_4$) that is able to vaporize is formed in an atmosphere of the film deposition of silicon oxide. Here, "able to vaporize" means that silicon tetrafluoride has an enough vapor pressure to vaporize in the atmosphere of the film deposition of the silicon oxide film. Silicon tetrafluoride is formed at the boundary between the silicon oxide film and the tungsten film, and the void is formed by escaping therefrom as a gas.

Japanese Patent Application Publication No. 2012-138500 discloses a method including steps of forming a tungsten film or a tungsten oxide film on an object to be processed, forming a seed layer on a tungsten film or a tungsten oxide film by supplying an aminosilane based gas while heating the object to be processed, and forming a silicon oxide film on the seed layer.

Japanese Patent Application Publication No. 2015-56633 discloses a method for manufacturing a silicon oxide film by placing a substrate in a reaction chamber, supplying hydrogen gas into the reaction chamber, and then supplying an oxidation gas and a silicon-containing gas into the reaction chamber.

In the above, fluorine remains in the tungsten film as impurities, and silicon tetrafluoride that is able to vaporize by reacting with silicon is formed while depositing the silicon oxide film deposited on the tungsten film, which generates a void. Moreover, in the method for manufacturing the semiconductor device having a structure including stacked first and second layers, when the first layer contains impurities that form a substance that is able to vaporize by reacting with a material of the second layer, a void is formed similarly to the above. In other words, the substance that is able to vaporize is formed from the impurities in the first film and the material of the second film while deposing the second film, and the substance is released therefrom, thereby forming the void at the boundary between the first film and the second film.

In the method for manufacturing the semiconductor device having the structure including the stacked first and second layers, when the first layer contains the impurities that form the substance that is able to form substance by reacting with the material of the second layer, a method for manufacturing a semiconductor device and a film deposition apparatus that can reduce the generation of the void at the boundary between the first layer and the second layer is demanded.

SUMMARY OF THE INVENTION

Accordingly, embodiments of the present disclosure may provide a method for manufacturing a semiconductor device and a film deposition apparatus that can prevent generation of a void.

According to an embodiment of the present invention, there is provided a method for manufacturing a semiconductor device. In the method, impurities contained in a first layer formed on a substrate are removed by heating the first layer. On the first layer, a second layer is formed containing a component that forms a substance that is able to vaporize by reacting with the impurities.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 12 is a sequential diagram illustrating and example of a method for manufacturing a semiconductor device according to a second embodiment of the present disclosure.

DESCRIPTION OF THE PREFERRED EMBODIMENTS

Figure 1:
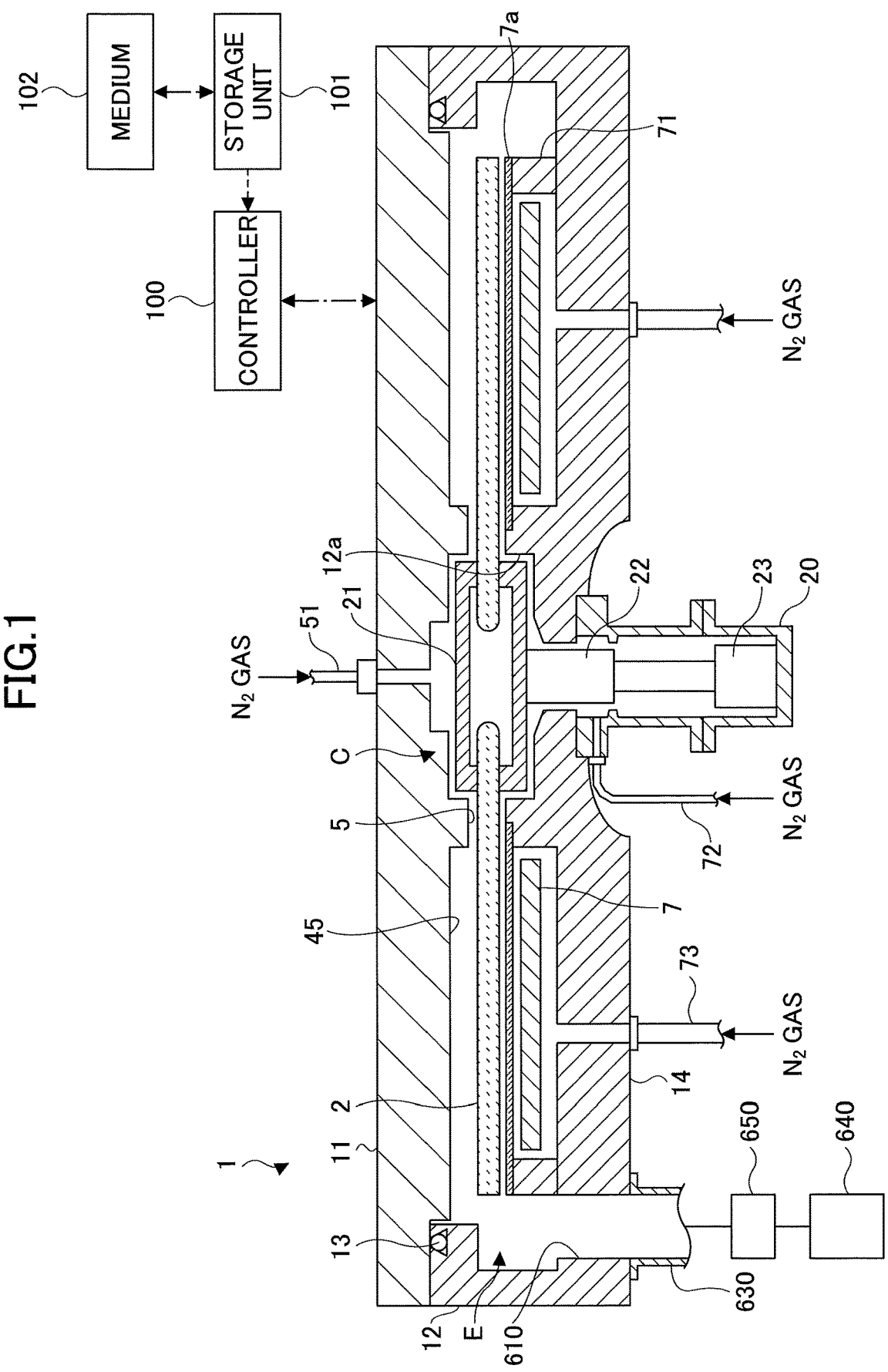
FIG. 1 is a cross-sectional view illustrating an example of a film deposition apparatus according to a first embodiment of the present disclosure applicable to a method for manufacturing a semiconductor device according to a first embodiment.

Embodiments of the present disclosure are described below with reference to the accompanying drawings. Descriptions of the same components will be omitted while providing the same numerals for the same components.

In a method for manufacturing a semiconductor device, when a silicon oxide film is formed on a tungsten film formed using tungsten hexafluoride as a source gas, a problem occurs of generating a void (i.e., pinhole) at a boundary between a silicon oxide film and a tungsten film. The void seems to be generated because fluorine (F) remaining in the tungsten film as impurities bonds with silicon at a boundary between the tungsten film and the silicon oxide film, thereby forming silicon tetrafluoride ($SiF_4$) that is able to vaporize, and silicon tetrafluoride is released therefrom as a gas. The expression "able to vaporize" means that silicon tetrafluoride has an enough vapor pressure to vaporize in an atmosphere in which the silicon oxide film is deposited.

To reduce the generation of void at the boundary between the silicon oxide film and the tungsten film in the above, there is a method of setting a film deposition temperature of the silicon oxide film at a low temperature. The lower the film deposition temperature of the silicon oxide film becomes, the less the diffusion of fluorine in the tungsten film becomes. By doing this, the bond between fluorine (F) and silicon is reduced, and the generation of void can be reduced. For example, a gas capable of depositing a silicon oxide film at a lower temperature is selected, and then an oxide film is deposited. A process at a temperature range is established in which fluorine in the tungsten film does not react with silicon while depositing a silicon oxide film. Also, a device is designed in which a silicon oxide film is deposited to a degree that does not tend to generate a void even if fluorine reacts with silicon when film deposition of the silicon oxide film is performed at a low temperature.

However, although the film deposition temperature of silicon oxide film is set at a low temperature in the above method, fluorine remaining in the tungsten film is not reduced and not removed. Hence, it is difficult to eliminate the generation of void caused by remaining fluorine.

Such a problem is not limited to the case of forming the silicon oxide film on the upper layer of the tungsten film containing fluorine. In the method for manufacturing the semiconductor device having a structure including stacked first and second layers, when the first layer contains impurities that form a substance that is able to vaporize by reacting with a material of the second layer, a void can be generated similarly to the above.

In the present embodiments, the impurities (fluorine) that remain in the first layer (tungsten film) and cause the void (pinhole) are removed by annealing the tungsten film at a high temperature before depositing the silicon oxide film. Then, the second layer (silicon oxide film) can be deposited without generating a void.

An example of a method for manufacturing a semiconductor device according to the present embodiment and a film deposition apparatus usable to the method for manufacturing the semiconductor device is described below.

First Embodiment

[Film Deposition Apparatus]

An example of a film deposition apparatus according to a first embodiment of the present disclosure is described below with reference to FIGS. 1 through 5. The film deposition apparatus according to the first embodiment of the present disclosure is a film deposition apparatus to which the method for manufacturing the semiconductor device according to the first embodiment of the present disclosure is preferably applicable. Here, the film deposition apparatus is a so-called turntable type (described below) film deposition apparatus using a susceptor. Hence, the film deposition apparatus is described below by citing an example of the turntable type film deposition apparatus in which a film is deposited on surfaces of a plurality of substrates by supplying a process gas including a source gas to a predetermined supply region. Here, the susceptor for receiving the substrate is not necessarily formed as the turntable type, and a variety of film deposition apparatuses using a nozzle is applicable.

Figure 2:
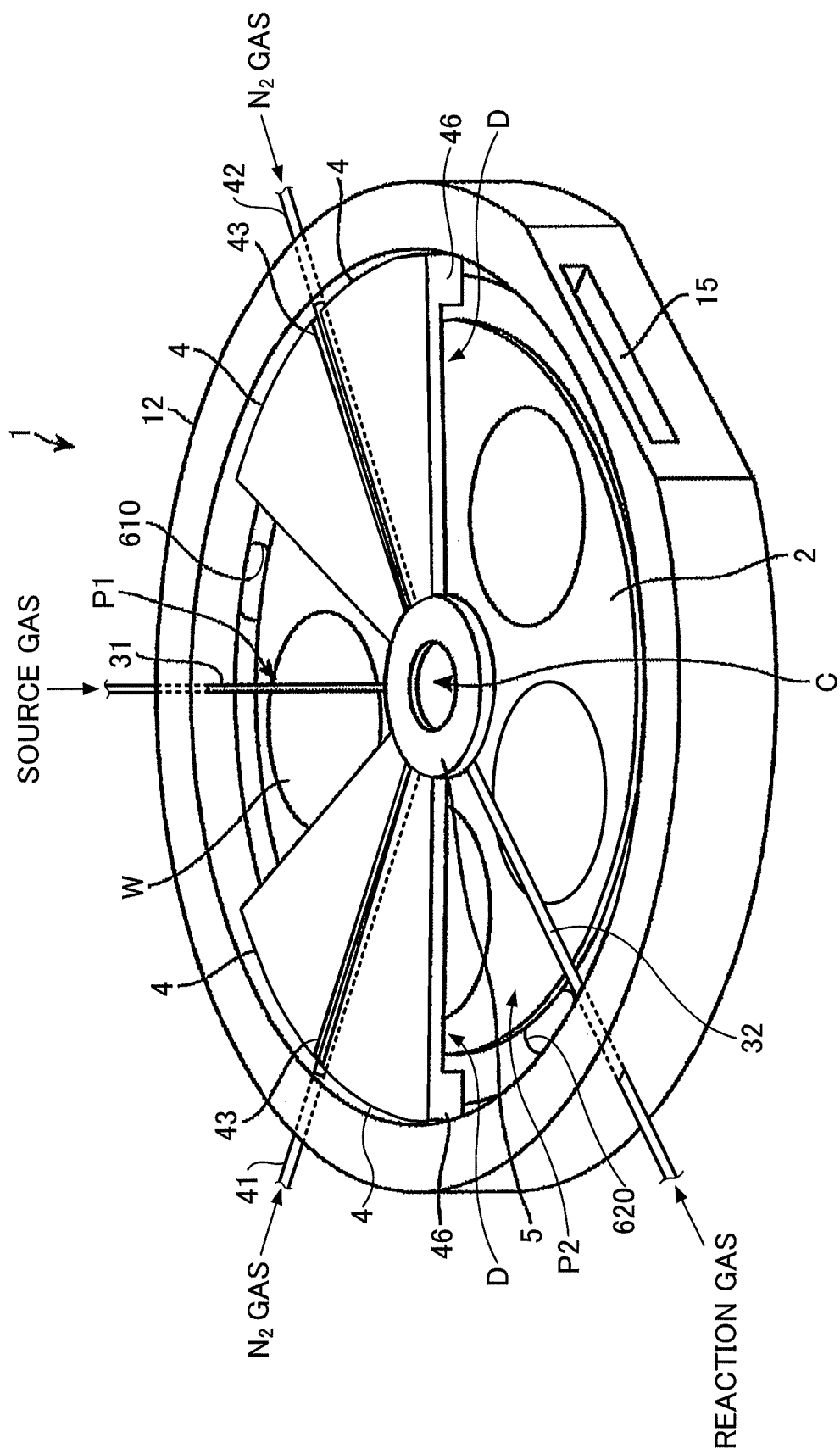
FIG. 2 is a perspective view illustrating an example of a structure inside a process chamber of the film deposition apparatus in FIG. 1.
Figure 3:
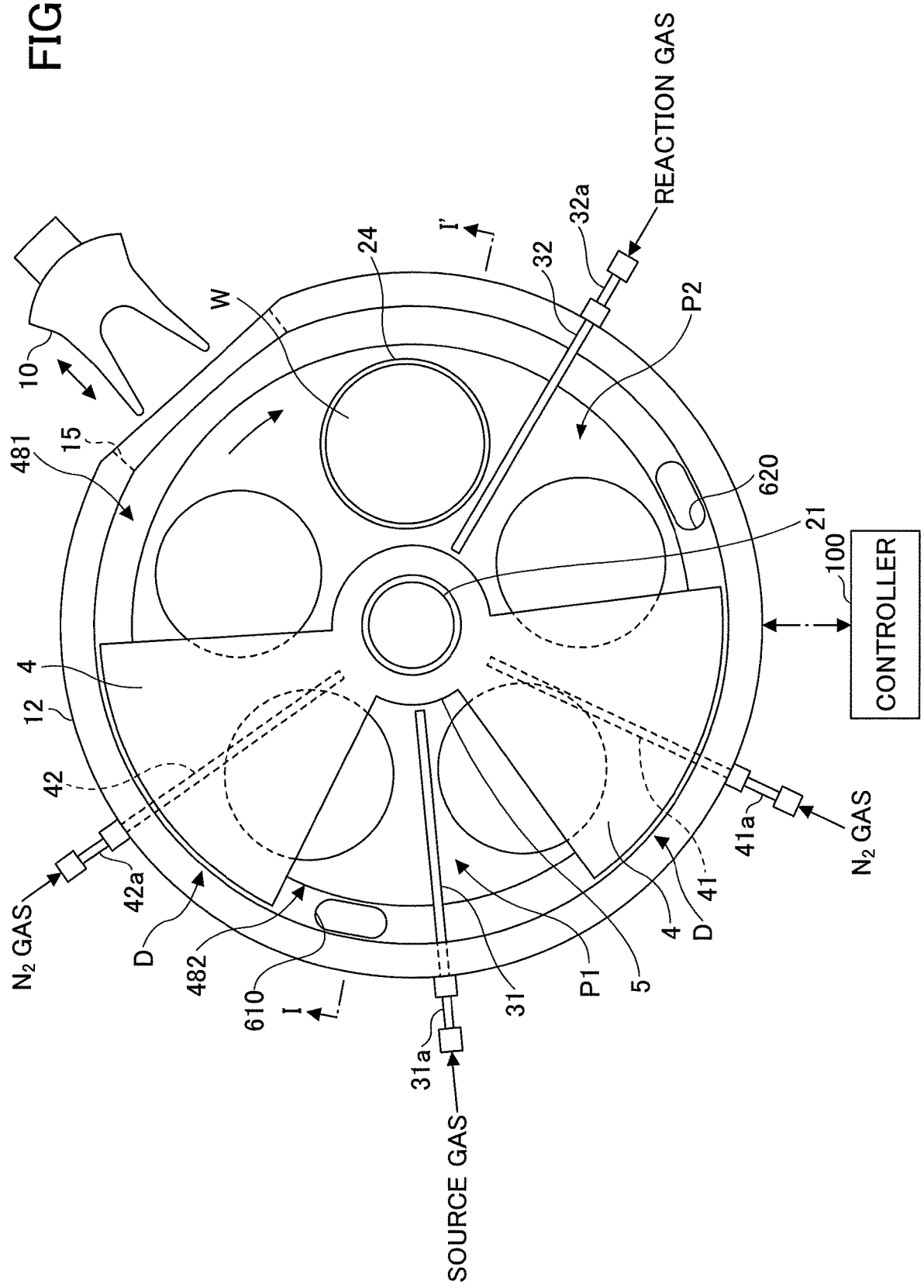
FIG. 3 is a top view illustrating an example of a structure inside a process chamber of the film deposition apparatus in FIG. 1.

FIG. 1 is a cross-sectional view of the film deposition apparatus, and illustrates a cross section taken along an I-I' line. FIGS. 2 and 3 are diagrams for explaining a structure inside a process chamber 1 (described below). The depiction of a top plate 11 (described below) is omitted in FIGS. 2 and 3 for convenience of explanation.

Figure 4:
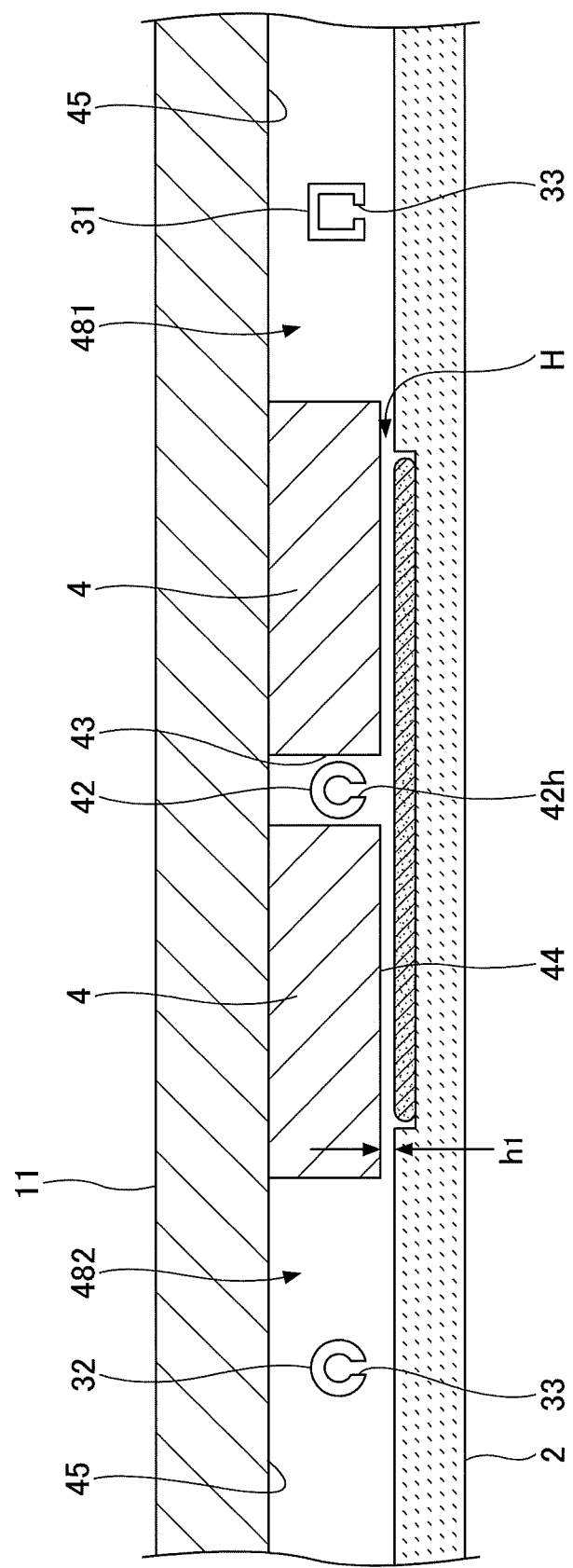
FIG. 4 is a partial cross-sectional view of the film deposition apparatus in FIG. 1.
Figure 5:
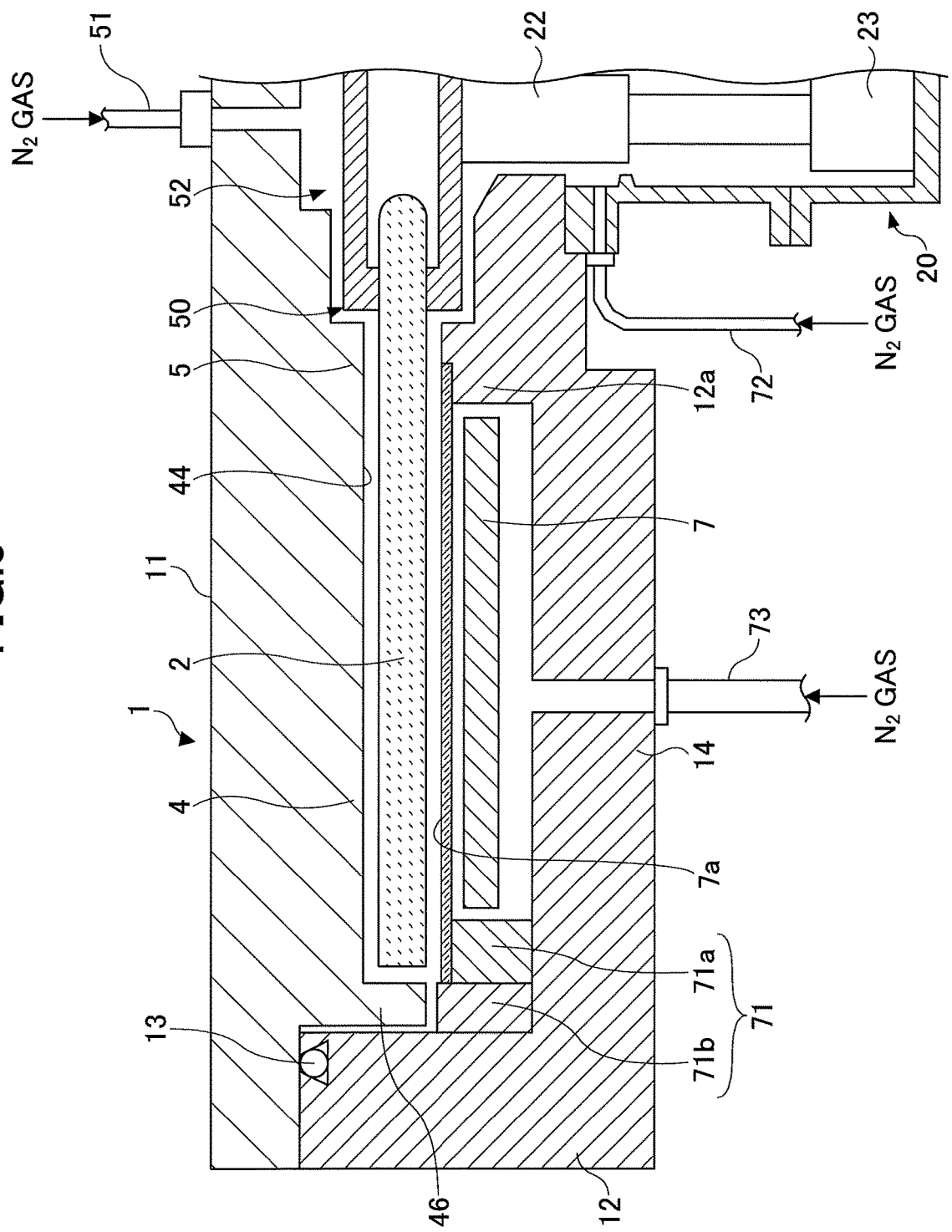
FIG. 5 is another partial cross-sectional view of the film deposition apparatus in FIG. 1.

FIG. 4 is a cross-sectional view of the process chamber 1 taken along a concentric circle of a susceptor 2 (described below) from a process gas nozzle 31 (described below) to a process gas nozzle 32 (described below). FIG. 5 is a partial cross-sectional view illustrating a region in which a ceiling surface 44 (described below) is provided.

As illustrated in FIGS. 1 through 3, the film deposition apparatus includes the process chamber 1 having a substantially circular shape in a plan view and a flat shape in a side view, the susceptor 2 disposed in the process chamber 1, and a controller (control unit) 100 for controlling operations of the entire substrate processing apparatus (e.g., the control unit 100 controls a timing of supplying gases from process gas nozzles 31 and 32).

The process chamber 1 includes a chamber body 12 formed into a closed-end cylinder and a top plate 11 that is placed on the chamber body 12 and detachable from the chamber body 12. The top plate 11 is attached to the chamber body 12 via a sealing member 13 (see FIG. 5) such as an O-ring and hermetically seals the process chamber 1.

The susceptor 2 is fixed to a cylindrical core part 21 housed in a case body 20 such that the center of the process chamber 1 coincides with the center of rotation of the susceptor 2. The susceptor 2 has holding areas in its upper surface to receive a plurality of substrates (which are hereafter referred to as "wafers W").

The case body 20 is a cylindrical case having an opening at its upper end. A flange at the upper end of the case body 20 is hermetically attached to a lower surface of a bottom part 14 of the process chamber 1. The case body 20 isolates the internal atmosphere of the process chamber 1 from the external atmosphere.

The core part 21 is fixed to an upper end of a rotational shaft 22 that extends in the vertical direction. The rotational shaft 22 penetrates through the bottom part 14 of the process chamber 1. A lower end of the rotational shaft 22 is attached to a drive unit 23 that rotates the rotational shaft 22 about a vertical axis. The rotational shaft 22 and the drive unit 23 are housed in the case body 20.

As illustrated in FIG. 3, multiple (five in the present embodiment) recesses 24 for holding the wafers W (substrate holding areas) are formed in the upper surface of the susceptor 2. The recesses 24 have a substantially circular shape and are arranged along the rotational direction (or the circumferential direction) of the susceptor 2. In FIG. 3, for convenience sake, only one wafer W placed in one of the recesses 24 is illustrated. The number of wafers W that the susceptor 2 can hold is not limited to five. The susceptor 2 that can be used in the embodiment of the present invention may instead be configured to hold four or less wafers W or six or more wafers W.

In the present embodiment, each of the recesses 24 has an inside diameter (e.g., 4 mm greater than the diameter of the wafer W) that is slightly greater than the diameter (e.g., 300 mm) of the wafer W. The depth of each of the recesses 24 is substantially the same as the thickness of the wafer W. This causes the height of the upper surfaces of the wafers W placed in the recesses 24 to become substantially the same as the height of the upper surface (where the wafers W are not placed) of the susceptor 2.

In the film deposition apparatus, the process gas nozzle 31 is a first gas supply part and is disposed in a first process region (described later) above the susceptor 2. As discussed above, the process gas nozzle is the nozzle of the embodiment described above, and is used as the process gas nozzle 30 for supplying a source gas in the film deposition apparatus of the present embodiment. The process gas nozzle 32 is a second gas supply part and is disposed in a second process region (described later) that is apart from the first process region in the circumferential direction of the susceptor 2. Separation gas nozzles 41 and 42 are separation gas supply parts and are disposed between the first process region and the second process region. For example, the nozzles 31, 32, 41, and 42 may be made of quartz.

More specifically, as illustrated in FIGS. 2 and 3, the process gas nozzle 32, the separation gas nozzle 41, the process gas nozzle 31, and the separation gas nozzle 42 are arranged clockwise (along the rotational direction of the susceptor 2) in this order from a transfer port 15 for transferring the wafers W. In other words, the process gas nozzle 32, the separation gas nozzle 41, the process gas nozzle 31, and the separation gas nozzle 42 are arranged at intervals along the circumferential direction of the process chamber 1. Gas introduction ports 31a, 32a, 41a and 42a, which are outer ends of the gas nozzles 31, 32, 41 and 42, are fixed to the outer peripheral wall of the chamber body 12. The gas nozzles 31, 32, 41 and 42 are inserted through the outer peripheral wall of the chamber body 12 into the process chamber 1. In the process chamber 1, the gas nozzles 31, 32, 41 and 42 extend parallel to the upper surface of the susceptor 2 in the radial direction of the chamber body 12 toward the center of rotation of the susceptor 2.

Multiple gas discharge holes 33 (see FIG. 4) facing the susceptor 2 are formed in the lower surface of each of the process gas nozzles 31 and 32. For example, the gas discharge holes 33 may be arranged at 10-mm intervals in the lengthwise direction of the corresponding process gas nozzle 31 or 32. Thus, a region below the process gas nozzle 31 functions as a region for causing a first process gas to adsorb on a wafer W (which is hereinafter referred to as a "first process region P1"). A region below the process gas nozzle 32 functions as a region for causing a second gas to react with the first process gas adsorbed on the wafer W so as to deposit a reaction product of the first process gas and the second process gas (which is hereinafter referred to as a "second process region P2"). Because the first process region P1 is a region for supplying a source gas, the first process region may be referred to as a "source gas supply region P1." Also, because the second process region P2 is a region for supplying a reaction gas that reacts with the source gas, the second process region P2 may be referred to as a "reaction gas supply region P2."

Here, for example, a source gas such as an organometallic gas used for depositing a high dielectric film (high-k film) may be used as the first process gas, and for example, tris (dimethylamino) cyclopentadienylzirconium ($C_{11}H_{23}N_3Zr$) and the like are available for the first process gas. A reaction gas such as an oxidation gas (e.g., $O_2$ gas or $O_3$ gas), a nitriding gas (e.g., $NH_3$ gas) or the like may be used as the second process gas.

In general, an organic metal compound used as a source gas to deposit a High-k film is a compound that contains amine, and contains an amino group (—$NH_2$, —NHR, —NRR'). For example, when the organic amino metal gas is oxidized by reacting with an oxidation gas, the amino group is released, and a harmful gas is generated. In the method for manufacturing the semiconductor device and the film deposition apparatus, the amino group may be sufficiently oxidized, and the harmful gas may be converted to a harmless gas. This point will be described below. In the meantime, the source gas is not limited to the above-gas, and a variety of gases may be used.

The process gas nozzle 32 is disposed in the second process region P2 that is zoned above the upper surface of the susceptor 2. The process gas nozzle 32 is connected to a gas supply source (not shown) for supplying the second process gas via a pipe and the like (not shown). Thus, the process gas nozzle 32 supplies the second process gas to the upper surface of the susceptor 2.

Each of the separation gas nozzles 41 and 42 is disposed between the first process region P1 and the second process region P2 that are provided apart from each other in the circumferential direction of the susceptor 2. Each of the separation gas nozzles 41 and 42 is connected to a gas supply source (not shown) for supplying a separation gas via a pipe and the like (not shown). Thus, the separation gas nozzles 41 and 42 supply the separation gas to the upper surface of the susceptor 2.

The film deposition apparatus of the present embodiment can use a variety of reaction gases reactable with the first process gas as the second process gas, but may use, for example, an oxygen-containing gas as the second process gas. The oxygen-containing gas is, for example, oxygen gas or ozone gas. The first process gas supplied from the process gas nozzle 31 and adsorbed on the substrate is oxidized by the second process gas supplied from the process gas nozzle 32, thereby generating an oxidation product.

In the present embodiment, the film deposition apparatus uses an inert gas as the separation gas. Examples of the inert gas include a noble gas such as argon (Ar) gas and helium gas, and nitrogen gas. The separation gas is used as a purge gas for purging the wafer W. In the present embodiment, a description is given below of an example of using $N_2$ gas, which is generally used as the purge gas, as the separation gas.

As illustrated in FIGS. 2 and 3, two convex portions 4 are provided in the process chamber 1 of the film deposition apparatus. In a plan view, each convex portion 4 has an approximately fan-like shape whose top part is cut off to form an arc (inner arc). In the present embodiment, the inner arc of the convex portion 4 is connected to a protruding portion 5. The convex portion 4 is disposed such that its outer arc (which is at an end of the convex portion 4 opposite to the inner arc) becomes substantially parallel to the inner circumferential surface of the chamber body 12 of the process chamber 1.

More specifically, as illustrated in FIG. 4, the convex portions 4 are attached to the lower surface of the top plate 11. The convex portion 4 includes a flat lower surface that is referred to as a ceiling surface 44 (first ceiling surface). Parts of the lower surface of the top plate 11 on both sides of the ceiling surface 44 in the circumferential direction are referred to as ceiling surfaces 45 (second ceiling surfaces). The ceiling surfaces 45 are higher than the ceiling surface 44. Thus, the convex portion 4 forms a narrow separation space(s) H and spaces 481 and 482, into which gas flows from the separation space H, in the process chamber 1. In other words, the convex portions 4 form narrow separation spaces H that function as separation areas D illustrated in FIG. 6.

Also, as illustrated in FIG. 4, a groove 43 is formed in the middle in the circumferential direction of the convex portion 4. The groove 43 extends in the radial direction of the susceptor 2. The separation gas nozzle 42 is placed in the groove 43 of one of the convex portions 4, and the separation gas nozzle 41 is placed in the groove 43 of the other one of the convex portions 4.

Here, gas discharge holes 42h are formed in a lower surface of the separation gas nozzle 42, which faces the susceptor 2. The gas discharge holes 42h are arranged at predetermined intervals (e.g., 10-mm intervals) in the lengthwise direction of the separation gas nozzle 42. The opening diameter of each of the gas discharge holes 42h is, for example, from about 0.3 mm to about 1.0 mm. Although not illustrated in the drawings, gas discharge holes are also formed in the separation gas nozzle 41 in a similar manner.

Furthermore, as illustrated in FIG. 4, the process gas nozzles 31 and 32 are disposed in spaces below the higher ceiling surfaces 45. The process gas nozzles 31 and 32 are positioned apart from the ceiling surfaces 45 and close to the wafer W or the upper surface of the susceptor 2. Here, as illustrated in FIG. 4, the process gas nozzle 31 is disposed in the space 481 (space below the higher ceiling surface 45), and the process gas nozzle 32 is disposed in the space 482 (space below the higher ceiling surface 45).

The process gas nozzles 31 and 32 are provided in the vicinity of the surface of the wafer W, and the discharge holes 33 are formed in the lower surface of each of the process gas nozzles 31 and 32 so as to face the surface of the wafer W. The distance between the discharge holes 33 of the process gas nozzles 31 and 32 and the surface of the susceptor 2 where the recesses 24 are not formed, is set in a range of 1 to 5 mm, preferably about 3 mmm for example. Moreover, the process gas nozzle 31 that supplies the source gas may be formed into a rectangular cross-sectional shape, as illustrated in FIG. 4. Here, the other process gas nozzle 32 and the separation gas nozzles 41 and 42 are formed into an annular cross-sectional shape.

The narrow separation space H is formed between the lower ceiling surface 44 and the upper surface of the susceptor 2. When an inert gas (e.g., $N_2$ gas) is supplied from the separation gas nozzle 42, the inert gas flows into the spaces 481 and 482 through the separation space H. Because the volume of the separation space H is smaller than the volumes of the spaces 481 and 482, the pressure in the separation space H where the inert gas is supplied becomes higher than the pressures in the spaces 481 and 482. Thus, the separation space H provides a pressure barrier between the spaces 481 and 482.

Furthermore, the flow of the inert gas from the separation space H into the spaces 481 and 482 functions as a counter flow to the first process gas in the first process region P1 and the second process gas in the second process region P2. Accordingly, the substrate processing apparatus of the present embodiment is configured to separate the first process gas in the first process region P1 from the second process gas in the second process region P2 by using the separation space H. In other words, the film deposition apparatus is configured to prevent the first process gas from mixing and reacting with the second process gas in the process chamber 1.

A height h1 of the ceiling surface 44 from the upper surface of the susceptor 2 can be determined based on the pressure in the process chamber 1 during a film deposition process, the rotational speed of the susceptor 2, and/or the amount of the supplied separation gas ($N_2$ gas) so that the pressure in the separation space H becomes higher than the pressures in the spaces 481 and 482. The height h1 of the ceiling surface 44 from the upper surface of the susceptor 2 can be also determined based on the specifications of the film deposition apparatus and types of supplied gases. Furthermore, the height h1 of the ceiling surface 44 from the upper surface of the susceptor 2 can be determined in advance by experiments or calculations.

As illustrated in FIGS. 2 and 3, the protruding portion 5 is provided on the lower surface of the top plate 11 to surround the core part 21 to which the susceptor 2 is fixed. The protruding portion 5 is connected to the center-side ends (inner arcs) of the convex portions 4. The lower surface of the protruding portion 5 is formed to have the same height as the ceiling surface 44.

As illustrated in FIG. 2, an L-shaped bent portion 46 is formed at the outer end of the convex portion 4 (i.e., an end that is closer to the inner circumferential surface of the vacuum chamber 1). The bent portion 46 faces the outer end surface of the susceptor 2. The bent portion 46 prevents gases from flowing between the space 481 and the space 482 through a gap between the susceptor 2 and the inner circumferential surface of the chamber body 12. The sectorial convex portion 4 is provided on the lower surface of the top plate 11.

A small gap is provided between the outer surface of the bent portion 46 and the chamber body 12 so that the top plate 11 can be detached from the chamber body 12. For example, the gap between the inner surface of the bent portion 46 and the outer end surface of the susceptor 2 and the gap between the outer surface of the bent portion 46 and the chamber body 12 can be set at a value that is substantially the same as the height of the ceiling surface 44 from the upper surface of the susceptor 2.

Figure 7:
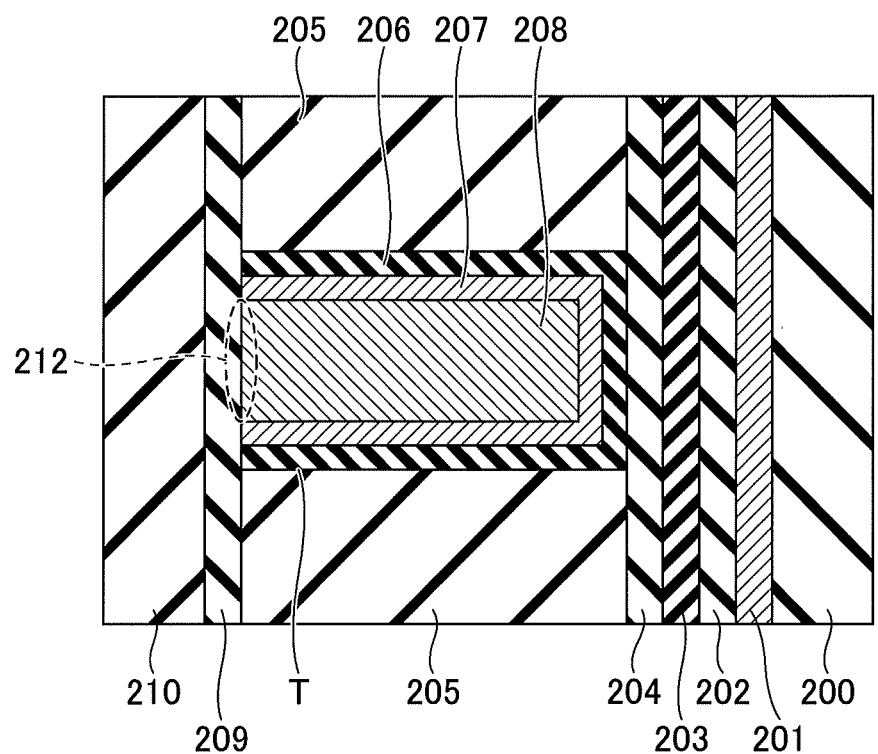
FIG. 7 is a partial enlarged cross-sectional view of the semiconductor device in FIG. 6.

Referring to FIG. 3 again, a first evacuation port 610 in communication with the space 481 (FIG. 4) and a second evacuation port 620 in communication with the space 482 (FIG. 4) are formed between the susceptor 2 and the inner circumferential surface of the chamber body 12. As illustrated in FIGS. 1 and 7, the first evacuation port 610 and the second evacuation port 620 are connected to evacuation units 640 and 641 (e.g., a vacuum pump) via evacuation pipes 630 and 631, respectively. Here, pressure controllers 650 and 651 may be provided in the evacuation pipes 630 and 631 between the first and second evacuation ports 610 and 620 and the vacuum pumps 640 and 641, respectively.

As illustrated in FIGS. 1 and 5, a heater unit 7 is provided in a space between the susceptor 2 and the bottom part 14 of the vacuum chamber 1. The heater unit 7 heats, via the susceptor 2, the wafers W on the susceptor 2 to a temperature (e.g., 450° C.) specified by a process recipe. A ring-shaped cover member 71 is provided below the outer periphery of the susceptor 2. The cover member 71 prevents entry of gases into a space below the susceptor 2.

As illustrated in FIG. 2, the cover member 71 includes an inner member 71a and an outer member 71b. The inner member 71a is provided below the susceptor 2 and spans a region that corresponds to the outer periphery of the susceptor 2 and a narrow space surrounding the outer circumference of the susceptor 2. The outer member 71b is provided between the inner member 71a and the inner circumferential surface of the vacuum chamber 1. The outer member 71b is disposed below the bent portion 46 formed at the outer end of the convex portion 4 such that a small gap is formed between the outer member 71b and the lower end of the bent portion 46. The inner member 71a surrounds the heater unit 7.

A source supply system to supply a source gas to the process gas nozzle 31 may include, for example, a carburetor, a mass flow controller, a manometer, a mass flow meter, an automatic pressure controller, a pipe, a valve and the like.

The controller 100 illustrated in FIG. 5 sends commands (or signals) to other components of the film deposition apparatus, thereby controlling operations of the components. The controller 100 may be constituted of a computer or an arithmetic processing unit for controlling operations of the entire film deposition apparatus. For example, the controller 100 executes a program stored in a storage unit 101 to control hardware components of the film deposition apparatus, thereby depositing a film on the surfaces of the plurality of wafers W. The controller 100 may include a central processing unit (CPU) and a memory (e.g., ROM or RAM).

More specifically, the memory of the control unit 100 may store a program for causing the film deposition apparatus (or the CPU) to perform a substrate process described later. The program may include code units corresponding to steps to be performed in the substrate process. The controller 100 reads the program from a storage medium 102 (e.g., a hard disk, a compact disk, a magneto-optical disk, a memory card, or a flexible disk), stores the program in the storage unit 101, and then installs or loads the program into the controller 100.

[Semiconductor Device]

Figure 6:
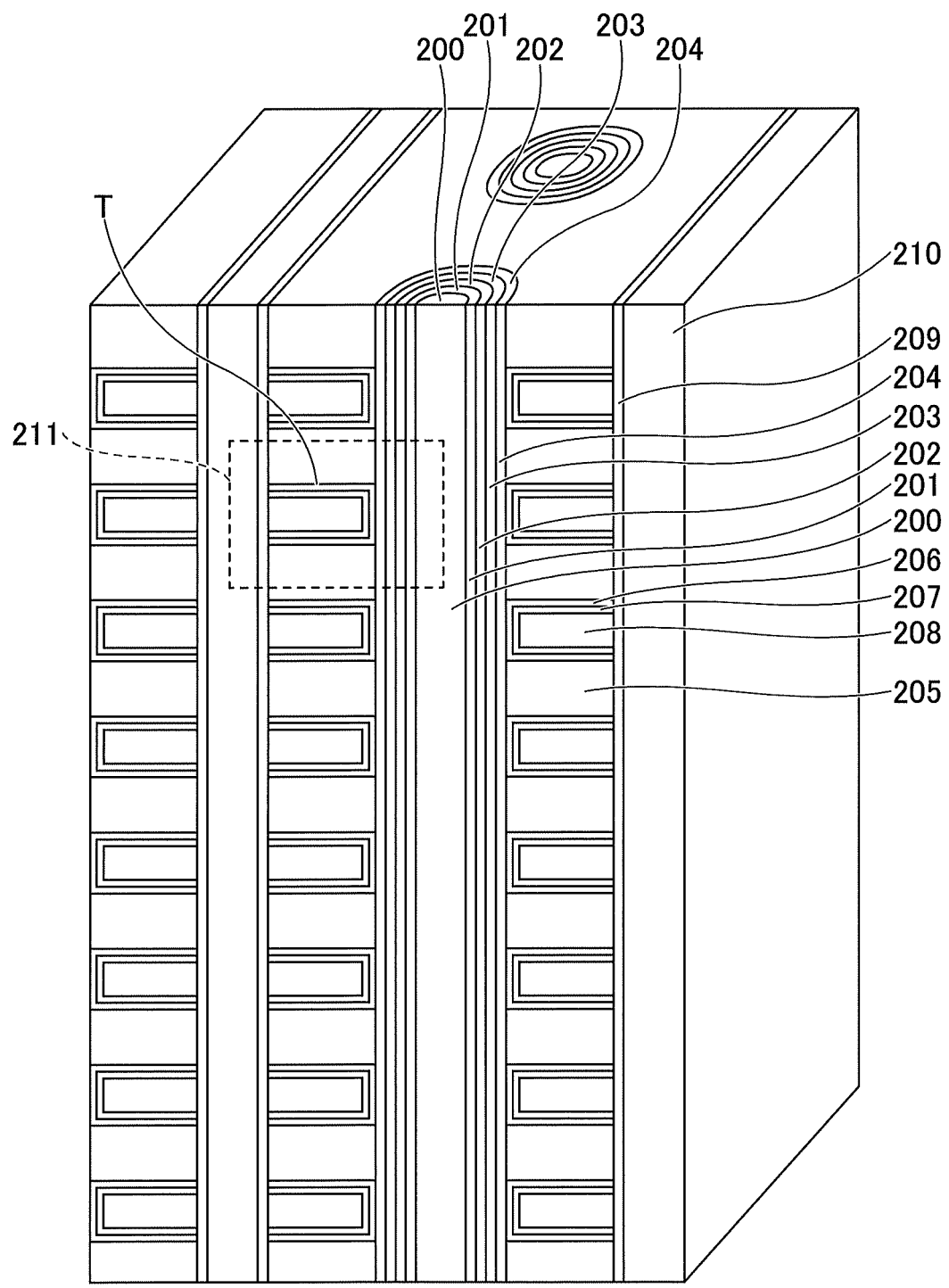
FIG. 6 is a perspective cross-sectional view illustrating an example of a semiconductor device applicable to a method for manufacturing a semiconductor device according to a first embodiment of the present disclosure.

FIG. 6 is a perspective cross-sectional view illustrating an example of a semiconductor device that can be manufactured by a method for manufacturing a semiconductor device according to the present embodiment. FIG. 7 is a partial enlarged cross-sectional view of a part (part enclosed by a broken line 211) of the semiconductor device in FIG. 6. The semiconductor device according to the present embodiment is a NAND type flash memory in which a memory cell transistor (memory cell) is three-dimensionally (3D) integrated.

A semiconductor layer of a poly silicon layer 201 having a channel region, a tunnel insulating film made of silicon oxide 202, a charge trap layer 203 made of silicon nitride, and a block insulating film 204 made of silicon oxide are stacked on an outer periphery of a filled insulating film having an approximately columnar shape and made of silicon oxide. The tunnel insulating film 202 may be a stacked insulating film constituted of silicon oxide film-silicon nitride-silicon oxide film. The filled insulating film made of silicon oxide is formed on the outer periphery of the block insulating film 204. Trenches T are formed in regions where gate electrodes of the memory transistors are to be formed of the filled insulating film 205. Inner walls of the trenches T are coated with trench coating insulating films 206 made of aluminum oxide having a high dielectric constant, and barrier metal layers 207 made of titanium nitride stacked on the trench coating insulating films 206. Gate electrodes 208 made of tungsten are formed by filling the trenches T on the barrier metal layers 207.

A seal insulating film 209 made of silicon oxide is formed on the gate electrodes 208. The seal insulating film 209 is also formed on the barrier metal layers 207, the trench coating insulating films 206, and the filling insulating films 205. Furthermore, the filling silicon oxide film 210 made of silicon oxide is formed on the seal insulating film 209.

The block insulating film 204, the charge trap layer 203, the tunnel insulating film 202 are stacked between the semiconductor layer 201 and the gate electrodes 208, thereby forming memory cell transistors having MONOS (Metal-Oxide-Nitride-Oxide-Silicon) structure.

By applying a predetermined voltage between the gate electrodes 208 and the semiconductor layer 201, electrons are injected into the charge trap layer 203 from the semiconductor layer 201 while penetrating through the tunnel insulating film 202. The charge trap layer 203 has a site such as a defect capable of trapping charge therein, and traps the injected electrons. When the electrons are not injected into the charge trap layer 203, the threshold of the transistors differs from the state in which the charge is injected into the charge trap layer 203. For example, the data of one bit corresponding to two values of "0" and "1" can be stored depending on the threshold. Moreover, the data of two bits corresponding to four values can be stored by storing four-stage thresholds depending on the number of the injected electrons. Furthermore, the data of more values can be stored such that the data of three bits corresponding to eight values by storing eight-stage thresholds and the like. In addition, the electrons in the charge trap layer 203 are released to the semiconductor layer 201 by applying a predetermined voltage to the gate electrodes 208 and the semiconductor layer 201. The charge trap layer 203 goes into a state without charged electrons, thereby returning the threshold of the transistors to the initial value. As discussed above, the transistors serve as memory cell transistors that store data. The semiconductor device according to the present embodiment illustrated in FIG. 6 is configured to be a semiconductor storage device of NAND type in which many memory cell transistors are connected in series.

The above-mentioned semiconductor device includes the seal insulating film 209 made of silicon oxide on the gate electrodes 208 made of tungsten. When fluorine remaining in the gate electrodes 208 is not reduced or removed, the remaining fluorine causes a void at a boundary (region indicated by the broken line in FIG. 7) between the gate electrodes 208 and the seal insulating layer 209.

In the present embodiment, as described below, fluorine remaining in the gate electrodes 208 made of tungsten that causes the void (pinhole) is removed by increasing a film deposition temperature of the seal insulating film 209 made of silicon oxide during the film deposition, or annealing the transistor at a high temperature before the film deposition. Then, by depositing the seal insulating film 209, the seal insulating film 209 can be deposited without generating a void.

The semiconductor device illustrated in FIGS. 6 and 7 is only an example of the semiconductor device to which the method for manufacturing the semiconductor device according to the first embodiment of the present disclosure can be applied. The method for manufacturing the semiconductor device according to the present embodiment is applicable to a semiconductor device having another structure.

[Method for Manufacturing Semiconductor Device]

Next, a method for manufacturing a semiconductor device according to a first embodiment is described below. FIGS. 8A through 8D are cross-sectional views illustrating processes of the method for manufacturing the semiconductor device according to the first embodiment of the present disclosure.

Figure 8A:
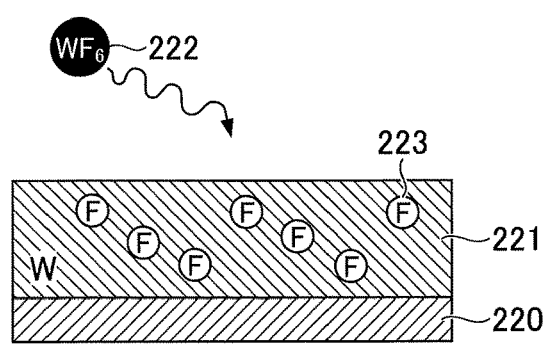
FIGS. 8A through 8D are cross-sectional views illustrating manufacturing processes of a method for manufacturing a semiconductor device according to a first embodiment of the present disclosure.

First, as illustrated in FIG. 8A, a tungsten (W) film 221 that becomes a gate electrode is deposited on a substrate by CVD or ALD, for example, using $WF_6$ as a source gas 222 and sets a process temperature at a first temperature so as to cause a reaction of $WF_6+3H_2 \rightarrow W+6HF$ on the substrate 220. The substrate 220, for example, includes the filling insulating film 200, the semiconductor layer 201, the tunnel insulating film 202, the charge trap layer 203, the block insulating film 204, the filling insulating film 205, the trench coating insulating film 206 and the barrier metal layer 207 of the semiconductor device illustrated in FIGS. 6 and 7. Fluorine (F) 223 remains in the tungsten film 221 as impurities when the tungsten film 221 is deposited by CVD or ALD using $WF_6$ as the source gas 222.

The tungsten film can be also deposited by CVD or ALD using $WCl_2$ as a source gas. In this case, chlorine (Cl) remains as impurities in the tungsten film 221. The film deposition temperature (first temperature) of the tungsten film 221 by CVD or ALD using $WCl_6$ is preferably set at 400° C. or higher, and the pressure during the film deposition is preferably set at 5 Torr or higher. This is because the film deposition reaction is unlikely to occur when the film deposition temperature is lower than 400° C., and because an etching reaction is likely to occur at 400° C. or higher when the pressure is lower than 5 Torr. When the film deposition temperature is 400° C., an amount of film deposition is likely to decrease at a pressure of 5 Torr, but is sufficiently obtained at a pressure of 10 Torr or higher. Hence, the film deposition temperature is preferably set at 400° C. or higher, and the pressure is preferably set at 10 Torr or higher. Moreover, because the amount of film deposition increases at a film deposition temperature of 500° C. and because the amount of film deposition is sufficiently obtained at a pressure of 5 Torr, the film deposition temperature and the pressure are preferably set at 500° C. or higher, and at 5 Torr of higher, respectively.

Figure 8B:
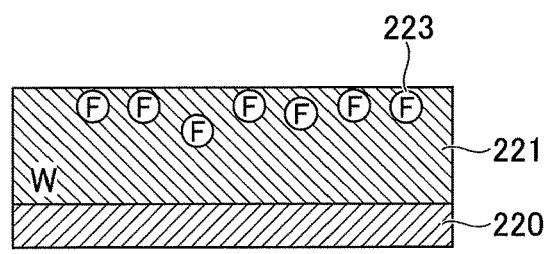
Figure 8C:
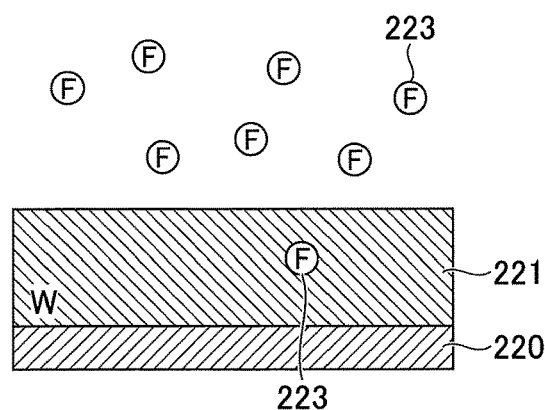

As illustrated in FIG. 8B, diffusion of fluorine (F) 223 that is impurities remaining in the tungsten film 221 is accelerated in the tungsten film 221 by heating the substrate 220 at a second temperature that is higher than the first temperature, and fluorine (F) 223 is released outside. As a result, as illustrated in FIG. 8C, fluorine 223 remaining in the tungsten film 221 is mostly removed. When the tungsten film 221 is formed by CVD or ALD using $WCl_6$ as the source gas, fluorine (Cl) remaining in the tungsten film 221 is removed.

The second temperature that is the temperature of the thermal treatment is set at a temperature that can accelerate the diffusion of fluorine 223 that are impurities in the tungsten film 221 and can sublimate fluorine 223 from the surface of the tungsten film 221 by the thermal treatment at the second temperature. The second temperature is higher than the first temperature that is the film deposition temperature of the tungsten film. The second temperature is preferably set at 620° C. or higher, and further preferably set at 700° C. or higher while the first temperature is about 400° C., for example. Fluorine in the tungsten film has peaks of an amount of sublimation at temperatures of 300° C., 620° C. and 700° C. as described below. As shown by working examples that will be described later, not only fluorine having a peak at 620° C. but also fluorine having a peak at 700° C. are mostly removed by heating the substrate 220 at 620° C. Accordingly, by heating the substrate at 620° C., fluorine that is the impurities in the tungsten film can be mostly removed. The second temperature can be made, for example, a film deposition temperature of a silicon oxide film in the next process. The upper limit of the second temperature can be made, for example, 1000° C.

The above thermal treatment is preferably performed in an atmosphere that can inhibit thermal oxidation of the tungsten film 221 to prevent or inhibit tungsten oxide from being generated by oxidizing the tungsten film 221. For example, such an atmosphere includes a reducing atmosphere formed by supplying hydrogen and the like, an atmosphere having a lower oxygen concentration than that in the process of forming the tungsten film 221, or a reducing atmosphere having a lower oxygen concentration than that of the process of forming the tungsten film 221.

Figure 8D:
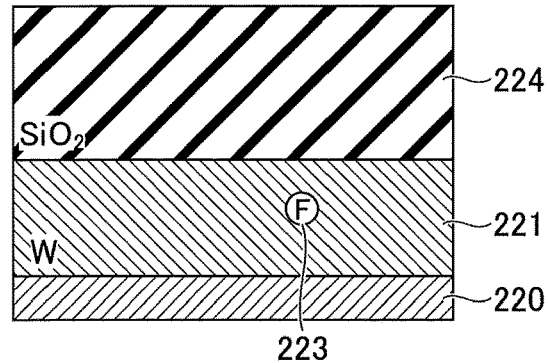

Next, as illustrated in FIG. 8D, a silicon oxide film 224 is formed on the tungsten film 221 by CVD or ALD, for example. For example, the silicon oxide film 224 is formed by thermally oxidizing silicon using a silicon-containing gas such as silane, and an oxygen-containing gas such as oxygen ($O_2$) and ozone ($O_3$) at the second temperature of 700° C. or higher as described above.

As discussed above, because the silicon oxide film 224 is formed after fluorine 232 remaining in the tungsten film 221 is removed by performing the thermal treatment at the second temperature, the reaction between fluorine and silicon at the boundary between the silicon oxide film and the tungsten film is reduced and mostly removed. As a result, the generation of void (pinhole) is reduced, and the silicon oxide film 224 can be deposited while scarcely generating the void. Thus, the void (pinhole) at the boundary between the silicon oxide film and the tungsten film can be removed, and film peel of the silicon oxide film can be prevented, thereby reducing device deterioration due to a decrease of the pinhole.

The above-mentioned thermal treatment and the film deposition process of the silicon oxide film are preferably performed in the same processing apparatus without exposing air. Because the tungsten film is liable to be oxidized when being exposed to air, the thermal treatment and the film deposition is performed without being exposed to air to prevent and inhibit the oxidation of the tungsten film.

For example, the above-mentioned thermal treatment and the film deposition process of the silicon oxide film can be performed without exposing to air (in-situ) using the film deposition apparatus illustrated in FIGS. 1 through 5. Moreover, the thermal treatment can be performed by incorporating to a recipe of the film deposition process of the silicon oxide film. Furthermore, while the substrate is heated to the second temperature to perform the film deposition process, the above-mentioned thermal treatment can be performed by utilizing a period for stabilizing the temperature at the second temperature.

The method for forming the silicon oxide film 224 on the upper layer of the tungsten film 221 is not limited, and a variety of film deposition methods is applicable. For example, the method described in Japanese Patent Application Publication No. 2012-138500 is applicable. In the method, a tungsten film is deposited on a substrate; a seed layer is formed on the tungsten film by supplying an aminosilane-based gas while heating the substrate; and the silicon oxide film is formed on the seed layer. Thus, an incubation period can be shortened, and the silicon oxide film can be deposited while preventing the oxidation of the tungsten film that is an undercoating film.

In addition, the method described in Japanese Patent Application Publication No. 2015-56633 is applicable to the process of forming the silicon oxide film 224 on the tungsten film 221. In other words, a substrate is placed in a process chamber; hydrogen gas is supplied (preflow) into the process chamber; and an oxidation gas and a silicon-containing gas are supplied into the process chamber. Thus, the oxidation of the tungsten film can be prevented, and when tungsten oxide is formed, tungsten oxide can be reduced to tungsten. When the above-mentioned thermal treatment process is performed in a reducing atmosphere by supplying hydrogen gas, hydrogen gas supplied in the thermal treatment process can be made a pre-flow as it is while depositing the silicon oxide film.

For example, the thermal treatment and the film deposition process of the silicon oxide film are performed using the film deposition apparatus illustrated in FIGS. 1 through 5. To begin with, a substrate on which a tungsten film 221 is formed is carried into the process chamber 1 of the film deposition apparatus from the transfer port 15. Next, the process chamber 1 hermetically closed by closing the transfer port 15, and hydrogen gas supply unit of the film deposition apparatus supplies hydrogen gas into the process chamber 1. The hydrogen gas supply unit may be provided in addition to the gas nozzles 31, 32, 41 and 42 similarly to the gas nozzles 31, 32, 41 and 42, or any of the gas nozzles 31, 32, 41 and 42 may be also used as the hydrogen gas supply unit. The temperature of the susceptor 2 is set at the second temperature while supplying hydrogen gas into the process chamber 1. After the susceptor 2 reaches the second temperature, a predetermined period is maintained, and the thermal treatment is performed at the second temperature. Next, the supply of hydrogen gas is stopped, and the supply of an oxygen-containing gas and a silicon-containing gas starts. Here, the process gas nozzle 31 supplies the silicon-containing gas, and the process gas nozzle 32 supplies the oxygen-containing gas. The silicon oxide film 224 is deposited on the tungsten film 221 on the substrate 220 at the second temperature that is higher than the first temperature of the film deposition temperature of the tungsten film. Oxygen or ozone is available for the oxygen-containing gas. For example, an aminosilane-based gas such as 3DMAS (tris(dimethylamino)silane, Si $(N(CH_3)_2)_4$) and 4DMAS (tetrakis(dimethylamino)silane), Si$(N(CH_3)_2)_4$), TCS (tetrachlorosilane, $SiCl_4$), DCS (dichlorosilane, $SiH_2Cl_2$), $SiH_4$ (monosilane), and HCD (hexachlorodisilane, $Si_2H_6$) and the like can be preferably used as the silicon-containing gas.

Thus, by increasing the film deposition temperature while depositing the silicon oxide film or by annealing the substrate before the film deposition, fluorine that remains in the tungsten film and causes a void (pinhole) is removed. Then, by depositing the silicon oxide film, the silicon oxide film can be deposited without generating a void.

In the above embodiment, when fluorine or chlorine remains in the tungsten film as impurities, the method of removing fluorine or chlorine by the thermal treatment and then forming the silicon oxide film has been described, but the method is not limited to this. In a method for manufacturing a semiconductor device having a structure including stacked first and second layers, when the first layer contains impurities that generate a substance that is able to vaporize, by reacting with a material of the second layer, a void is formed similarly to the above. In other words, the substance that is able to vaporize is generated from the impurities in the first layer and the material of the second layer while depositing the second layer, and the substance is released, thereby forming a void at a boundary between the first layer and the second layer. In the present embodiment, the first layer is formed on the substrate, and impurities contained in the first layer are removed by heating the first layer. Next, the second layer containing a component that forms a substance that is able to vaporize by reacting with the impurities is formed on the first layer. According to the present embodiment, even if the first layer contains impurities that form the substance that is able to vaporize by reacting with the material of the second layer when the second layer is stacked on the first layer, the generation of a void at the boundary between the first layer and the second layer can be reduced. For example, the method can be applied to the case in which the first layer contains fluorine, chlorine and the like as impurities, and a titanium nitride is formed on the first layer as the second layer. Moreover, the method can be applied to the case in which the first layer contains fluorine and the second is made of a ruthenium containing layer. [Method for Manufacturing Semiconductor Device of Comparative Examples]

Subsequently, a method for manufacturing a semiconductor device of comparative examples is described below. FIGS. 9A through 9D are cross-sectional views illustrating manufacturing processes of a method for manufacturing a semiconductor device of comparative examples.

Figure 9A:
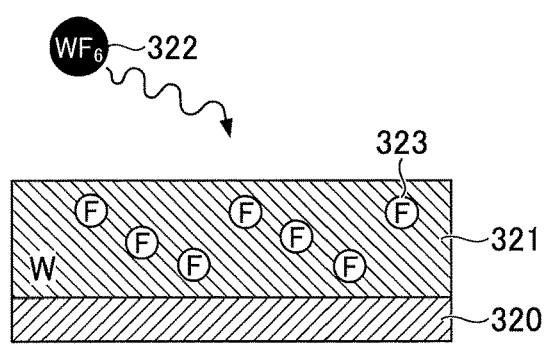
FIGS. 9A through 9D are cross-sectional views illustrating manufacturing processes of a method for manufacturing a semiconductor device of a comparative example of the present disclosure.

To begin with, as illustrated in FIG. 9A, for example, a tungsten (W) film 321 that becomes a gate electrode is deposited on a substrate by CVD or ALD, for example, using $WF_6$ as a source gas 322 and sets a process temperature at a first temperature so as to cause a reaction of $WF_6$+$3H_2 \rightarrow W+6HF$ on the substrate 220. The substrate 320, for example, includes a filling insulating film 200, a semiconductor layer 201, a tunnel insulating film 202, a charge trap layer 203, a block insulating film 204, a filling insulating film 205, a trench coating insulating film 206, and a barrier metal layer 207 of the semiconductor device illustrated in FIGS. 6 and 7. Fluorine (F) 323 remains in the tungsten film 321 as impurities when the tungsten film 321 is deposited by CVD or ALD using $WF_6$ as the source gas 322.

Figure 9B:
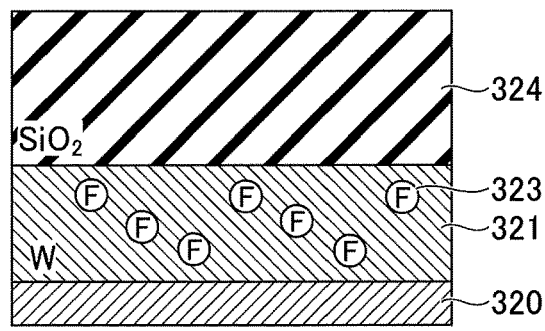

Next, as illustrated in FIG. 9B, a silicon oxide film 324 is formed on the tungsten film 321 by CVD or ALD, for example. For example, the silicon-oxide film 324 is formed using a silicon-containing gas such as a silane and an oxygen-containing gas such as oxygen ($O_2$) and ozone ($O_3$).

Figure 9C:
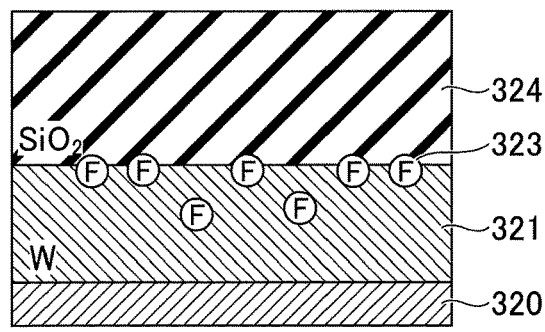
Figure 9D:
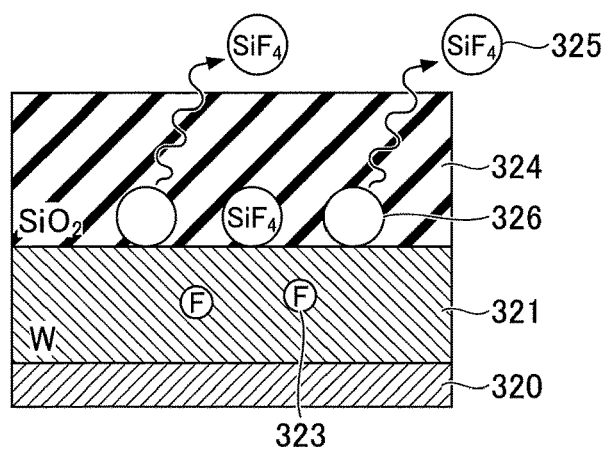

As discussed above, when the silicon oxide film 324 is formed while fluorine 323 remains in the tungsten film 321, as illustrated in FIG. 9C, fluorine 323 in the tungsten film 321 starts diffusing and moves to the boundary between the silicon oxide film 324 and the tungsten film 321. Then, as illustrated in FIG. 9D, the moved fluorine 323 reacts with the silicon oxide film 324 and produces silicon fluoride 325. Silicon fluoride 325 has a vapor pressure that is able to vaporize, and is released from the boundary between the silicon oxide film 324 and the tungsten film 321. As a result, a void (pinhole) is generated. Small pieces peel from the silicon oxide film 324, and the device is deteriorated due to the pinhole.

In contrast, according to the method for manufacturing the semiconductor device of the present embodiment, fluorine that causes a void is removed from a tungsten film by heating the tungsten film before depositing a silicon oxide film, and then the silicon oxide film is deposited without generating a void by depositing the silicon oxide film.

[Working Examples]

TDS (Thermal Desorption Spectroscopy) Test:

TDS test is a test that increases a temperature of a sample by irradiating the sample with lamp light in a vacuum and detects desorption gas from the sample by a mass spectrometer.

In the working examples, a thermal oxidation film was deposited on a silicon substrate at a film thickness of 100 nm by CVD; a silicon nitride film was deposited on the thermal oxidation film at a thickness of 5 nm by CVD; and a tungsten film was deposited on the silicon nitride film at a thickness of 15 nm by CVD. As described above, a sample A of a comparative example was produced. In CVD for forming a tungsten film, $WF_6$ gas was used as a source gas, and fluorine remained as impurities in the tungsten film.

A sample B was produced by performing a thermal treatment on the sample A at 300° C. using the film deposition apparatus illustrated in FIGS. 1 through 5 in the above embodiment. Moreover, a sample C was similarly produced by performing the thermal treatment on the sample B at 620° C. The TDS test was performed on the samples A, B and C by gradually increasing the temperature. Here, a rate of temperature increase was set at 60° C./minute, and an amount of desorption gas was measured as intensity of the mass spectrometer corresponding thereto when the substrate temperature was increased from room temperature to 900° C.

Figure 10:
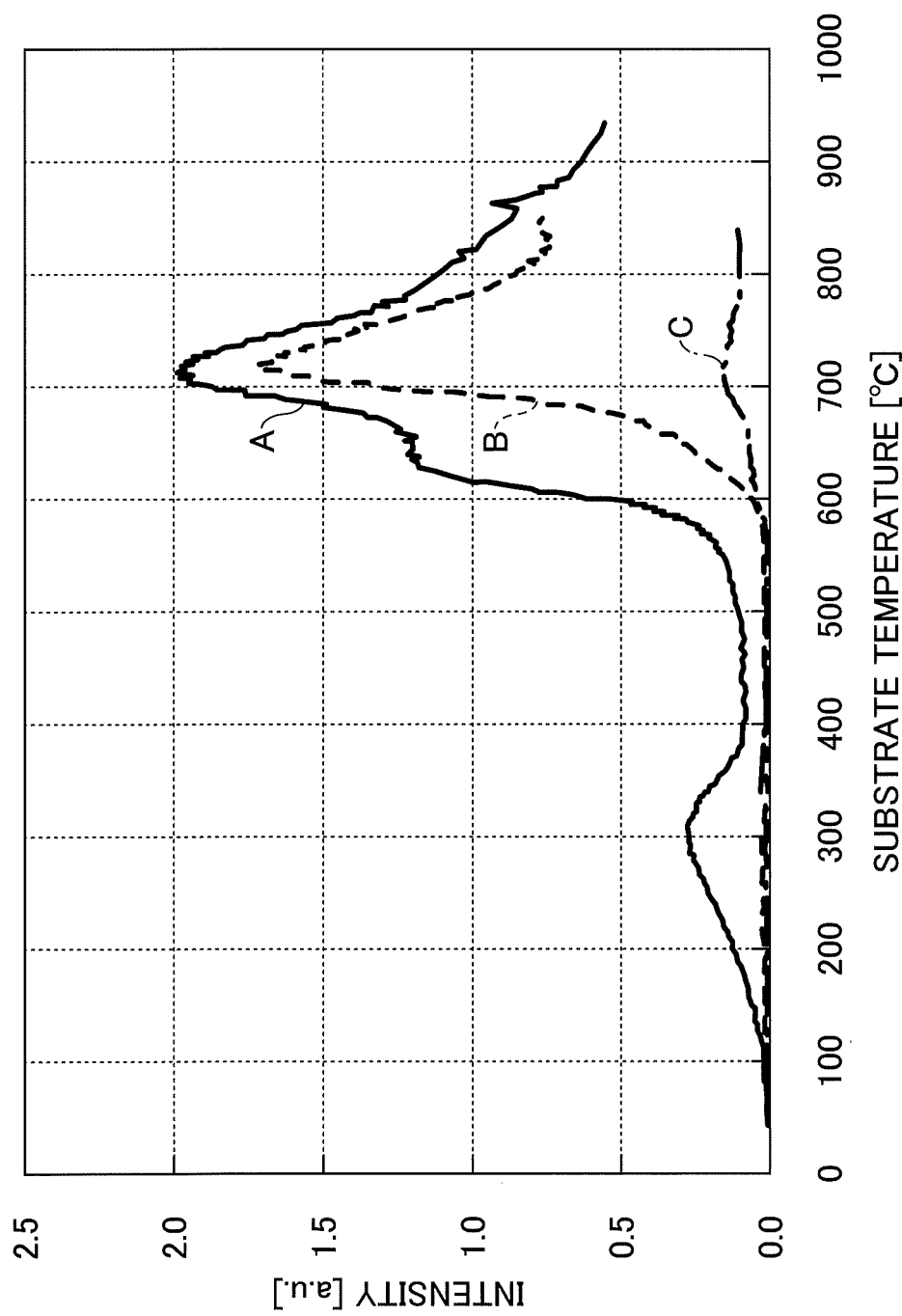
FIG. 10 is a diagram illustrating a result of heated desorption gas analysis of an example of the present disclosure.

FIG. 10 is a diagram showing a result of temperature increased desorption gas analysis of the working examples. FIG. 10 shows the TDS test result for samples A, B and C as a solid line A, a broken line B and a dashed-dotted line C, respectively. In FIG. 10, a horizontal axis indicates a substrate temperature (° C.), and a vertical axis indicates the intensity (a. u.) of the mass spectrometer.

The TDS result of the sample A indicates that fluorine in the tungsten film has peaks of an amount of sublimation at temperatures of 300° C., 620° C. and 700° C.

The TDS result of the sample C indicates that fluorine of the sublimation having the peak at 300° C. is removed by performing a thermal treatment of 300° C. The result also indicates that fluorine of the sublimation having the peak at 620° C. is mostly removed, but that fluorine having the peak at 700° C. mostly remains.

The TDS result of the sample C indicates that not only fluorine of the sublimation having the peak at 620° C. but also fluorine of the sublimation having the peak at 700° C. are mostly removed. Hence, the result indicates that fluorine that is impurities in the tungsten film can be mostly removed by performing the thermal treatment at the second temperature of 620° C. or higher.

Second Embodiment

Next, a film deposition apparatus and a method for manufacturing a semiconductor device according to a second embodiment of the present disclosure are described below.

[Film Deposition Apparatus]

Figure 11:
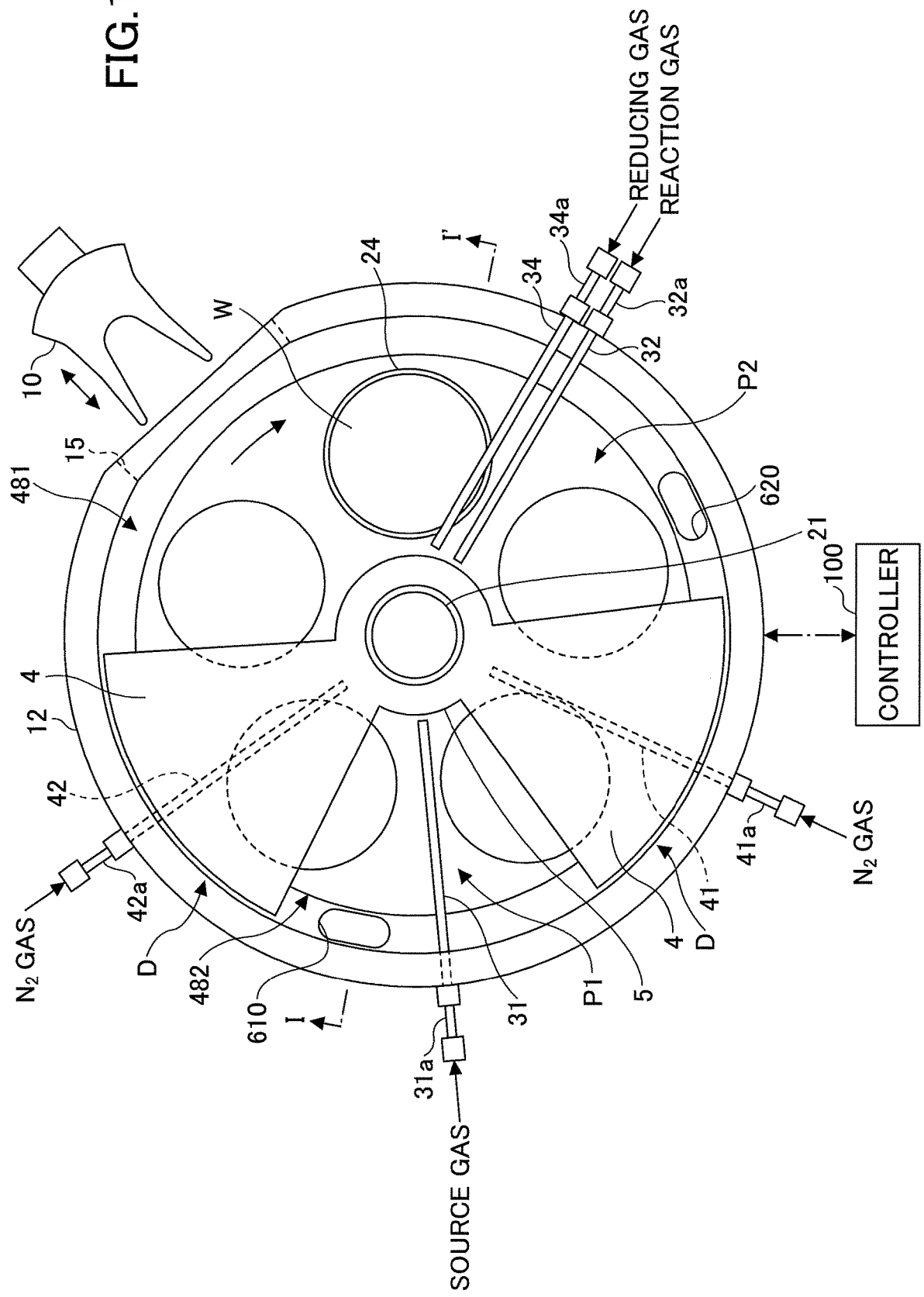
FIG. 11 is a plan view illustrating an example of a film deposition apparatus according to a second embodiment of the present disclosure.

FIG. 11 is a plan view illustrating an example of a film deposition apparatus according to a second embodiment. The film deposition apparatus according to the second embodiment and illustrated in FIG. 11 differs from the film deposition apparatus according to the first embodiment in that a process gas nozzle 34 is added to the second process region P2.

The process gas nozzle 34 is a gas supply unit to supply a reducing gas to a wafer W. A variety of gases may be used depending on the intended purpose as the reducing gas. For example, a hydrogen atom containing gas may be used as the reducing gas, and for example, hydrogen ($H_2$), ammonia ($NH_3$) and the like may be used as the reducing gas. When the second layer to be deposited in the film deposition process is an oxide film, for example, hydrogen gas is used as the reducing gas.

The process gas nozzle 34 may be provided to extend from the inner peripheral surface of the chamber body 12 of the vacuum chamber 1 toward the center of the susceptor 2 parallel to the surface of the susceptor 2 similarly to the process gas nozzle 32. Moreover, a reducing gas may be introduced via a gas introduction port 34a installed in an outer peripheral wall of the chamber body 12.

The process gas nozzle 32 supplies a reaction gas capable of producing a reaction product by reacting with a source gas, as described in the first embodiment. The second layer to be deposited on the wafer W is an oxide film, the process gas nozzle 32 supplies an oxidation gas such as oxygen. Here, the oxidation gas may be oxygen radicals activated by thermal oxidation.

Thus, the film deposition apparatus according to the second embodiment is configured to supply a reducing gas and a reaction gas separately from each other. Here, in FIG. 11, the reducing gas is supplied from upstream in a rotational direction of the susceptor 2, and a reaction gas is suppled from downstream in the rotational direction of the susceptor 2. However, this order may be opposite to each other. Moreover, in FIG. 11, although the process gas nozzle 32 and the process gas nozzle 34 are arranged adjacent to each other, the process gas nozzles 32 and 34 may not be necessarily arranged adjacent to each other. However, in deposing an oxide film, because OH* (hydroxyl radicals) having intense oxidation power is produced by combining hydrogen with oxygen, when the oxidation power is desired to be increased, the process gas nozzles 32 and 34 are preferred to be arranged close to each other up to a distance that can produce hydroxyl radicals.

Moreover, FIG. 11 depicts an example of forming supply units of the reducing gas and the oxidation gas as the process gas nozzles 32 and 34, but these may be configured to be together as a showerhead. Thus, the reducing gas supply unit and the reaction gas supply unit may be configured variously depending on the intended purpose.

Furthermore, the controller 100 is configured to be able to supply the reducing gas from the process gas nozzle 34. The controller 100 controls the whole of the film deposition apparatus, and can perform a method for manufacturing a semiconductor device according to a second embodiment.

Because the other components have the same configuration as those of the film deposition apparatus according to the first embodiment, the description is omitted.

[Method for Manufacturing Semiconductor Device]

Next, a method for manufacturing a semiconductor device according to the second embodiment is described below.

FIG. 12 is a sequential diagram illustrating an example of the method for manufacturing the semiconductor device. The method for manufacturing the semiconductor device according to the second embodiment is described below by citing an example of using the film deposition apparatus illustrated in FIG. 11.

A first layer formed on a wafer W is a tungsten film, and an example of depositing a silicon oxide ($SiO_2$) on the tungsten film as a second layer is described below. Also, an example of using hydrogen gas as a reducing gas and oxygen gas as a reaction gas is described below.

In the first embodiment, the example of depositing the silicon oxide ($SiO_2$) film on the tungsten film of the first layer is described. However, in the film deposition of the silicon oxide film on the tungsten film, the underlying tungsten film may be oxidized by being affected by an oxidant (oxidation gas) needed for the film deposition, and conductivity is liable to decrease due to an increase of a resistance value of the tungsten film. The tungsten film is very easily oxidized, and a natural oxide film is frequently formed on a surface of the tungsten film. In other words, the surface layer of the tungsten film is frequently already oxidized due to a reaction with air. In such a case, a property of high conductivity that the tungsten film naturally has is liable not to be sufficiently exerted only by inhibiting the oxidation of the silicon oxide film.

Therefore, the method for manufacturing the semiconductor device according to the second embodiment proposes a method for depositing a silicon oxide film without newly oxidizing the tungsten film while removing an oxidation component on the surface of the tungsten film caused by natural oxidation. Such a method for manufacturing the semiconductor device is very effective when the fluorine component is removed as described in the first embodiment and when the oxidation component is further removed. In other words, both impurities of the fluorine component and the oxidation component contained in the tungsten film can be removed, and the film can be deposited on the tungsten film while maintaining the properties of the high-quality tungsten film. Hence, such a method for manufacturing the semiconductor device is described below.

First, as a condition, the process is performed of removing impurities contained in the first layer by the thermal treatment described in FIGS. 8A through 8C in the first embodiment.

More specifically, a tungsten film 221 formed on a surface of a substrate 220 is heated, thereby fluorine 223 in the tungsten film 221 is removed. Because this process is described in FIGS. 8A through 8C, a detailed description is omitted.

After performing the process of removing impurities by the thermal treatment of FIGS. 8A through 8C, the sequence illustrated in FIG. 12 is performed.

In FIG. 12, the horizontal axis indicates time. As illustrated in step S100 of FIG. 12, first, hydrogen is supplied to the substrate 220, thereby performing hydrogen supply process (or reducing process). More specifically, the process gas nozzle 34 provided in the second process region P2 supplies hydrogen gas as the reducing gas. On this occasion, oxygen gas of the oxidation gas is not supplied, and only hydrogen gas is supplied in the second process region P2. Moreover, the source gas is not supplied in the first process region P1.

Thus, by rotating the susceptor 2 while supplying only hydrogen gas, a reducing atmosphere is formed in the second process region P2, the tungsten film 221 is reduced. In other words, an oxidation component such as a natural oxidation film formed on the surface of the tungsten film 221 is removed by reduction.

In step S110, the supply of source gas starts, and a source gas supply process is performed. More specifically, the process gas nozzle 31 in the first process region P1 supplies a silicon-containing gas of the source gas. A variety of gases such as 3DMAS described in the first embodiment can be used as the silicon-containing gas. By supplying the silicon-containing gas to the tungsten film 221 from which the oxide attached to the surface layer is removed, the silicon-containing gas adsorb on the surface layer of the tungsten film 221, and silicon layers made of a few or several atomic layers are formed. In other words, the surface of the tungsten film 221 is coated with silicon by being capped, thereby preventing the surface of the tungsten film 221 from which the oxide is removed from being oxidized again.

On this occasion, the supply of hydrogen in the second process region P2 is continued, and oxygen is not supplied continuously. Thus, after the source gas is supplied to the substrate 220, because the substrate 220 passes the reducing atmosphere, the source gas adsorbs on the surface of the substrate 220 while preventing the oxidation of the surface of the substrate 220.

In step S120, the supply of oxidant starts, and the silicon layer formed on the surface of the tungsten film 221 is oxidized, and a silicon oxide film is deposited on the tungsten film 221. More specifically, the process gas nozzle 32 in the second process region P2 supplies oxygen gas, and the oxidation of the source gas starts. Because a silicon layer is formed in a state in which an oxide is removed from the surface of the tungsten film 221, and because the silicon oxide film is formed, the silicon oxide film can be formed on the tungsten film 221 without a tungsten oxide film ($WO_x$) that increases the resistance value of the tungsten film 221.

After that, the susceptor 2 is continued to rotate while supplying hydrogen, the silicon-containing gas, and oxygen gas, the silicon oxide film (second layer 224) is deposited by ALD.

Here, in the hydrogen gas supply process (or reducing process) of step S100, the source gas supply process of step S110, and the oxygen gas supply process (or oxidizing process) of step S120, all of the substrates 220 on the susceptor 2 need to be exposed to hydrogen gas, the source gas, the oxidation gas at least one time, but the number of rotations of the susceptor at each step S100, S110, and S120 can be determined properly depending on the intended purpose. In other words, when the sufficient reduction is needed, a period for step S100 may be made longer, and a period of each step can be adjusted depending on the intended purpose.

Moreover, in the second embodiment, to facilitate understanding of the embodiment, an example in which the first layer 221 and the second layer 224 are made of the tungsten film and the silicon oxide film, respectively, and hydrogen gas, oxygen gas and the silicon-containing gas are used as the reducing gas, the oxidation gas and the source gas, respectively, was cited, but the oxidation gas, the reducing gas and the like can be variously combined. For example, as described in the first embodiment, the second layer may be made of a titanium oxide film or a ruthenium-containing layer.

Furthermore, in the second embodiment, an example of requiring the impurities removing process in the first embodiment was described as a condition, but a sequence of performing only steps S100 through S120 of FIG. 12 without performing the fluorine removal process may be performed instead.

The method for manufacturing the semiconductor device according to the second embodiment can remove an oxidation component of a surface layer of a first layer, and can form a thin film of a second layer while exerting the performance of the second layer on the first layer.

According to the method for manufacturing the semiconductor device and the film deposition apparatus of the embodiments of the present disclosure, even if a first layer contains impurities that can form a substance that is able to vaporize by reacting with a second layer when the second layer is stacked on the first layer, generation of void at a boundary between the first layer and the second layer can be reduced.

Application of the present disclosure is not limited to a NAND type flash memory. For example, as long as a semiconductor device has a tungsten film and a silicon oxide film on the tungsten film, the present disclosure can be applied to any of the semiconductor device All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A method for manufacturing a semiconductor device, comprising steps of:
    removing impurities contained in a first layer formed on a substrate by heating the first layer, the first layer containing a component that is able to form an oxide film;
    removing an oxidation component contained in the first layer by supplying a reducing gas to the substrate in a reducing atmosphere after the steps of removing the impurities;
    depositing an atomic layer of a source gas of a second layer on the first layer by supplying the source gas of the second layer to the first layer in the reducing atmosphere;
    depositing an oxide film on the first layer by oxidizing the source gas by supplying the atomic layer of the source gas formed on the first layer by suppling an oxidation gas after the step of depositing the atomic layer of the source gas on the first layer; and
    forming on the first layer a second layer containing a component that forms a substance that is able to vaporize by reacting with the impurities,
    wherein the reducing gas is hydrogen gas;
    wherein the oxidation gas is oxygen gas;
    wherein the substrate is placed along a circumferential direction of a susceptor rotatable and provided in a process chamber;
    wherein a source gas supply region is configured to supply the source gas to the substrate and provided above the susceptor and along the circumferential direction of the susceptor;
    wherein a reducing/oxidizing region is configured to supply hydrogen gas and/or oxygen gas to the substrate and provided above the turntable and apart from the source gas supply region in the circumferential direction of the susceptor;
    wherein the step of removing the oxidation component contained in the first layer is performed by supplying hydrogen gas without supplying oxygen gas at the reducing/oxidizing region while rotating the susceptor so as to pass the reducing/oxidizing region at least one time;
    wherein the step of depositing the atomic layer of the source gas on the first layer is performed by causing the substrate to pass the source gas supply region while supplying the source gas at the source gas supply region after causing the substrate to pass the reducing/oxidizing region at least one time; and
    wherein the step of depositing the oxide film on the first layer by oxidizing the source gas is performed by causing the substrate to pass the reducing/oxidizing region while supplying hydrogen gas and oxygen gas at the reducing/oxidizing region after causing the substrate to pass the source gas supply region at least one time.

2. The method as claimed in claim 1, wherein after the step of depositing the oxide film on the first layer by oxidizing the source gas, the steps of supplying the source gas to the substrate and supplying hydrogen gas and the oxidation gas to the substrate are periodically repeated by rotating the susceptor multiple times while supplying the source gas at the source gas supply region and while supplying hydrogen gas and oxygen gas at the reducing/oxidizing region.

* * * * *